US011810892B2

(12) United States Patent
Derakhshandeh et al.

(10) Patent No.: US 11,810,892 B2
(45) Date of Patent: Nov. 7, 2023

(54) METHOD OF DIRECT BONDING SEMICONDUCTOR COMPONENTS

(71) Applicant: IMEC vzw, Leuven (BE)

(72) Inventors: Jaber Derakhshandeh, Tienen (BE); Eric Beyne, Heverlee (BE); Gerald Peter Beyer, Heverlee (BE)

(73) Assignee: IMEC vzw, Leuven (BE)

( * ) Notice: Subject to any disclaimer, the term of this patent is extended or adjusted under 35 U.S.C. 154(b) by 334 days.

(21) Appl. No.: 17/102,249

(22) Filed: Nov. 23, 2020

(65) Prior Publication Data

US 2021/0159207 A1 May 27, 2021

(30) Foreign Application Priority Data

Nov. 26, 2019 (EP) ..................................... 19211529

(51) Int. Cl.
*H01L 23/00* (2006.01)
*B23K 1/008* (2006.01)
(Continued)

(52) U.S. Cl.
CPC .............. *H01L 24/81* (2013.01); *B23K 1/008* (2013.01); *H01L 23/49811* (2013.01);
(Continued)

(58) Field of Classification Search
CPC ......... B23K 1/008; H01L 24/81; H01L 24/06; H01L 24/14; H01L 24/16; H01L 24/17;
(Continued)

(56) References Cited

U.S. PATENT DOCUMENTS 9,754,893 B2 9/2017 Ding et al.
10,014,235 B2 7/2018 Takamoto et al.
(Continued)

FOREIGN PATENT DOCUMENTS

EP 2840872 A1 2/2015
JP 2004-253598 A 9/2004

OTHER PUBLICATIONS

Extended European Search Report for European Patent Application No. EP19211529.3, dated Feb. 19, 2020 in 9 pages.

*Primary Examiner* — Alonzo Chambliss
(74) *Attorney, Agent, or Firm* — Knobbe, Martens, Olson & Bear, LLP

(57) ABSTRACT

A method of bonding semiconductor components is described. In one aspect a first component, for example a semiconductor die, is bonded to a second component, for example a semiconductor wafer or another die, by direct metal-metal bonds between metal bumps on one component and corresponding bumps or contact pads on the other component. In addition, a number of solder bumps are provided on one of the components, and corresponding contact areas on the other component, and fast solidified solder connections are established between the solder bumps and the corresponding contact areas, without realizing the metal-metal bonds. The latter metal-metal bonds are established in a heating step performed after the soldering step. This enables a fast bonding process applied to multiple dies bonded on different areas of the wafer and/or stacked one on top of the other, followed by a single heating step for realizing metal-metal bonds between the respective dies and the wafer or between multiple stacked dies. The method allows to improve the throughput of the bonding process, as the heating step takes place only once for a plurality of dies and/or wafers.

8 Claims, 4 Drawing Sheets

(51) Int. Cl.
*H01L 23/498* (2006.01)
*B23K 101/40* (2006.01)

(52) U.S. Cl.
CPC .............. *H01L 24/06* (2013.01); *H01L 24/14* (2013.01); *H01L 24/16* (2013.01); *H01L 24/17* (2013.01); *H01L 24/94* (2013.01); *H01L 24/97* (2013.01); *B23K 2101/40* (2018.08); *H01L 2224/0603* (2013.01); *H01L 2224/06136* (2013.01); *H01L 2224/06155* (2013.01); *H01L 2224/1403* (2013.01); *H01L 2224/14136* (2013.01); *H01L 2224/14155* (2013.01); *H01L 2224/14177* (2013.01); *H01L 2224/14515* (2013.01); *H01L 2224/14517* (2013.01); *H01L 2224/16145* (2013.01); *H01L 2224/16146* (2013.01); *H01L 2224/16148* (2013.01); *H01L 2224/1703* (2013.01); *H01L 2224/17136* (2013.01); *H01L 2224/17155* (2013.01); *H01L 2224/17177* (2013.01); *H01L 2224/17517* (2013.01); *H01L 2224/8183* (2013.01); *H01L 2224/8192* (2013.01); *H01L 2224/81143* (2013.01); *H01L 2224/81191* (2013.01); *H01L 2224/81192* (2013.01); *H01L 2224/81193* (2013.01); *H01L 2224/81815* (2013.01); *H01L 2224/81906* (2013.01); *H01L 2224/81907* (2013.01)

(58) Field of Classification Search
CPC ... H01L 24/94; H01L 24/97; H01L 23/49811; H01L 2224/14515
See application file for complete search history.

(56) References Cited

U.S. PATENT DOCUMENTS

| | | |
|---|---|---|
| 2004/0232537 A1 | 11/2004 | Kobrinsky et al. |
| 2005/0269714 A1 | 12/2005 | Akram et al. |
| 2008/0290505 A1* | 11/2008 | Kolan ................ H01L 23/3128 257/E23.101 |
| 2011/0084375 A1 | 4/2011 | Eu et al. |
| 2015/0130072 A1 | 5/2015 | Wu et al. |
| 2017/0025387 A1* | 1/2017 | Ichikawa ................ H01L 24/94 |
| 2017/0162518 A1 | 6/2017 | Liao et al. |

* cited by examiner

METHOD OF DIRECT BONDING SEMICONDUCTOR COMPONENTS

CROSS-REFERENCE TO RELATED APPLICATIONS

This application claims foreign priority to European Patent Application No. EP 19211529.3, filed on Nov. 26, 2019, the contents of which including the specification, the drawings, and the claims is hereby incorporated by reference in its entirety.

BACKGROUND

Technological Field

The disclosed technology is generally related the 3D stacking and interconnecting of integrated circuit dies and wafers.

Description of the Related Technology 3D stacking provides shorter interconnects to enable reduction in power consumption and higher operating frequency of the electronic devices which are part of an integrated circuit. Fine pitch micro bumps and Through Silicon Vias (TSV) enable high density interconnects and therefore high bandwidth data transfer between different blocks or partitions to further improve the performance and functionality of electronic devices.

Direct metal to metal connection is key for 3D stacking for both wafer to wafer and die to wafer bonding methods. There are two methods of metal bonding in 3D stacking: direct bonding and solder bonding. Direct bonding offers many advantages over solder bonding, such as a lower electrical resistance, cheaper processing, direct TSV to pad bonding and scaling to smaller pitches. However, the bonding process for directly bonding a metal bump to a metal pad or bump of the same or another metal is slow. The process takes a heating step during tens of minutes, and therefore has lower throughput, especially for die to wafer bonding. The long bonding times can be acceptable for wafer to wafer bonding, as the wafers contain many dies that are bonded simultaneously during one bonding process. However, for die to wafer bonding, the throughput will be low.

Therefore, especially for die to wafer applications, a fast bonding method is needed, and today this is often the solder bonding approach. In solder-based bonding a metal with low melting point such as Sn, In, Bi or their alloys is used for fast bonding in the range of a few seconds with low pressures. However, solder bonding also suffers from a number of disadvantages, such as the formation of an intermetallic compound which raises reliability issues. Furthermore, the contact resistance is higher, the technique is not scalable and the bump processing is expensive.

SUMMARY OF CERTAIN INVENTIVE ASPECTS

Embodiments of the disclosed technology provide a fast bonding method for 3D stacking, that does not suffer from the above drawbacks.

According to one embodiment of the disclosed technology, a first component, for example a semiconductor die, is bonded to a second component, for example a semiconductor wafer or another die, by direct metal-metal bonds between metal bumps on one component and corresponding bumps or contact pads on the other component. In addition, a number of solder bumps are provided on one of the components, and corresponding contact areas on the other component, and fast solidified solder connections are established between the solder bumps and corresponding contact areas, without realizing the metal-metal bonds. The latter metal-metal bonds are established in a heating step performed after the soldering step. This enables a fast bonding process applied to multiple dies bonded on different areas of the wafer and/or stacked one on top of the other, followed by a single heating step for realizing metal-metal bonds between the respective dies and the wafer or between multiple stacked dies. The method allows to improve the throughput of the bonding process, as the heating step takes place only once for a plurality of dies and/or wafers.

Another embodiment of the disclosed technology includes a method of bonding a first semiconductor component to a second semiconductor component, at least one of the components including a plurality of protruding metal contact structures, by bonding the plurality of protruding contact structures to corresponding protruding metal contact structures or metal contacts pads on the other component, the bonding taking place by direct metal to metal contact bonding, wherein:

one of the components is provided with a plurality of solder bumps for establishing solidified solder connections between the solder bumps and corresponding contact areas provided on the other component, and the method includes:

aligning the components so that the solder bumps are aligned to the corresponding contact areas, realizing the solidified solder connections between the corresponding solders bumps and contact areas, wherein the solder bumps and contact areas are configured so that the protruding metal contact structures of one of the components are in physical contact with the corresponding protruding metal contact structures or the metal pads of the other component while not forming a metal bond, when the solidified solder connections are established, thereby obtaining an assembly of the first and second component bonded only through the solder connections, and subjecting the assembly to a heat treatment for bonding the protruding metal contact structures to the corresponding metal structures or pads. According to some embodiments, during the heat treatment no mechanical pressure is applied for pushing the components together.

According to an embodiment, the surface area of the solder bumps and the contact areas is chosen so that during the soldering process applied for realizing the solidified solder connections, the molten solder material enhances the alignment of the solder bumps to the contact areas due to a self-aligning influence of the capillary forces exhibited by the molten material on the solder bumps and the contact areas.

According to an embodiment, the surface area of the solder bumps is higher than the surface area of the metal contact structures. The first component may be a semiconductor die, and the second component may be a semiconductor wafer.

According to an embodiment, a plurality of dies are bonded to the wafer by aligning and establishing solidified solder connections, and subjecting the assembly to a heat treatment is performed simultaneously for the plurality of dies.

A plurality of dies may be bonded in at least one stack, a first die being bonded to the wafer by aligning and establishing solidified solder connections, and one or more additional dies being bonded to the back side of preceding dies by aligning and establishing solidified solder connections, wherein subjecting the assembly to a heat treatment is performed simultaneously for the at least one stack of dies.

The solder bumps may be dummy solder bumps.

According to an embodiment, the protruding metal contact structures and corresponding pads are arranged in a two-dimensional array, wherein the solder bumps and corresponding contact areas are located around the respective arrays.

According to an embodiment, the protruding metal contact structures and the corresponding metal structures or pads are formed of the same metal.

According to an embodiment, a dielectric underfill material is applied that fills the gaps between the solder connections and the bonded metal protrusions.

BRIEF DESCRIPTION OF THE DRAWINGS

The figures illustrate the disclosed technology in a schematic way. The relative dimensions of the depicted features are not necessarily in proportion to actual electronic components.

DETAILED DESCRIPTION OF CERTAIN ILLUSTRATIVE EMBODIMENTS

Figure 1A:
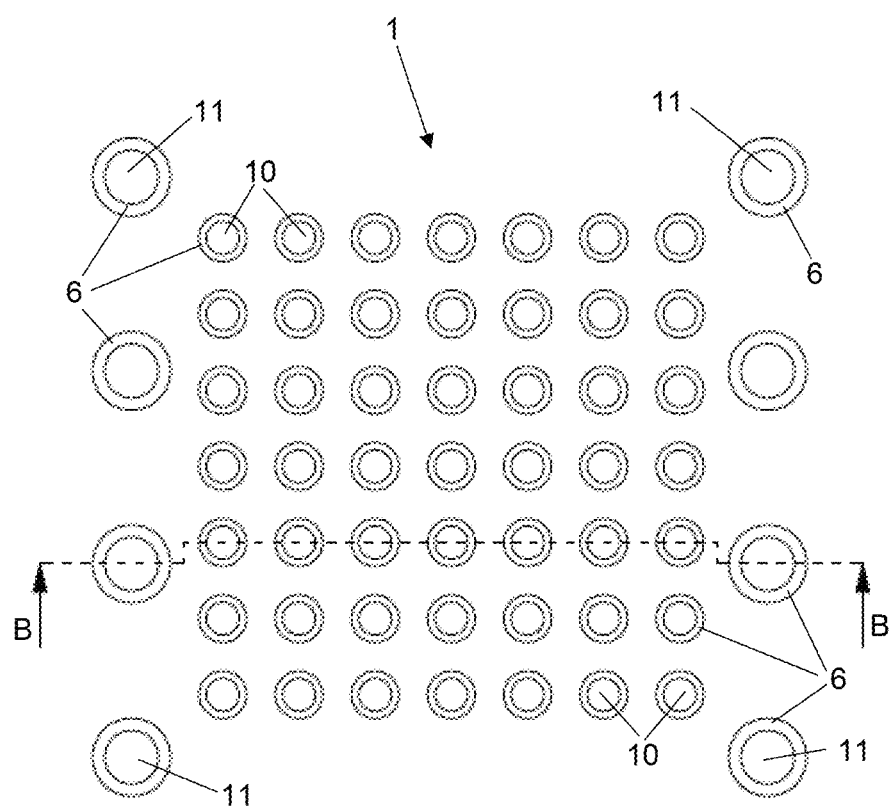
FIG. 1A illustrates a portion of the surface of a semiconductor die, comprising an array of contact bumps and specifically placed solder bumps around the array.
Figure 1B:
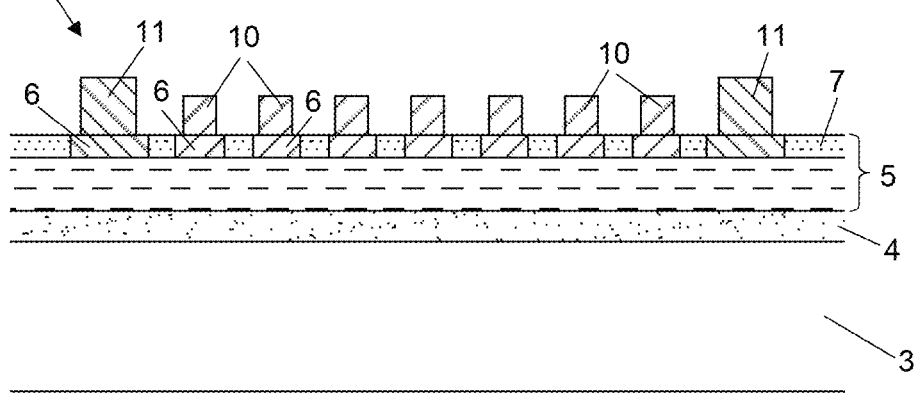
FIG. 1B shows a cross section of the area shown in FIG. 1A.
Figure 2A:
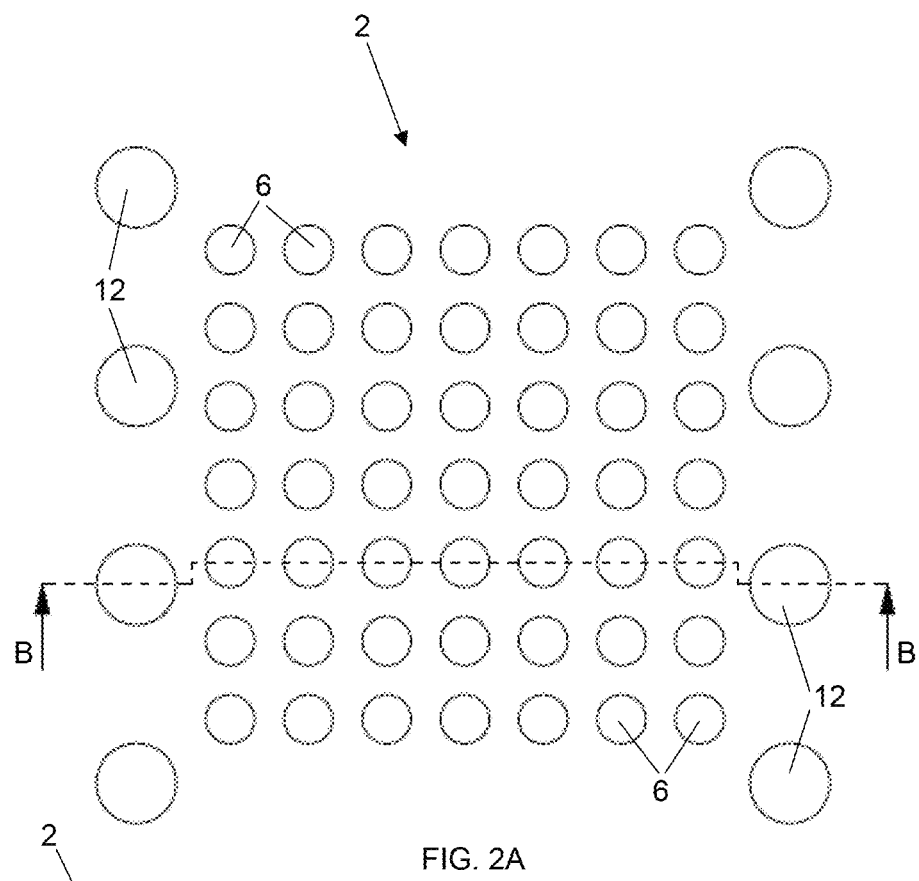
FIG. 2A illustrates a portion of the surface of a semiconductor wafer, including an array of contact pads and specifically placed contact areas around the array.
Figure 2B:
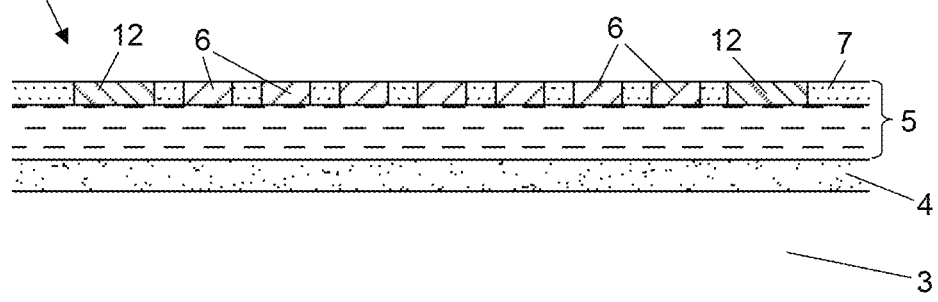
FIG. 2B shows a cross section of the area shown in FIG. 2A.

The disclosed technology will be described on the basis of an exemplary, non-limiting embodiment. According to the embodiment, a semiconductor die is bonded to a semiconductor wafer. The wafer includes a plurality of processed dies, which are yet to be separated. The semiconductor die is to be bonded to one of these processed dies or a part thereof, to form a 3D stack of interconnected dies. Both these semiconductor components, the separate die and the wafer, include a number of contact structures on their surface, which may be metal contact bumps or contact pads.

FIGS. 1A-1B and 2A-2B illustrate corresponding portions, respectively, of the die 1 and of the wafer 2, which are to be bonded together. As well known to the skilled reader, both the die 1 and the wafer 2 include a semiconductor substrate 3, most commonly a silicon substrate, and on top thereof a plurality of active devices such as transistors and diodes in the front end of line (FEOL) part 4, and a network of interconnect lines and vias embedded in a dielectric material in the back end of line (BEOL) part 5. The upper layer of the BEOL part 5 is shown in more detail and includes contact pads 6 embedded in the dielectric 7. The BEOL network is connected to a plurality of terminals on the surfaces of the die 1 and of the wafer 2. In the case of the die 1 shown in FIGS. 1A-1B, the terminals appear in the form of contact structures 10 protruding outward from the surface of the contact pads 6. These protruding contact structures will hereafter be referred to as contact bumps 10. In the case of the wafer 2 shown in FIGS. 2A-2B, the terminals are the actual contact pads 6 as such, lying essentially in the plane of the surface of the wafer 2. Planar contact pads could also be formed on top of the BEOL part 5 of the wafer 2. According to other embodiments, both components could be provided with contact bumps 10 which are to be bonded to each other. The process described hereafter is applicable to the bonding of contact bumps to pads or bumps of the same metal, for example to establish a Cu—Cu bond, a Co—Co bond or a Ni—Ni bond. Bonding between different metals is not excluded from the scope of the disclosed technology, although this may require the addition of additives to the metals, such as catalyst metals like Au or Pt, added in the form of colloids.

The contact bumps 10 of the die 1 are to be bonded to the contact pads 6 on the wafer 2, by the direct metal-metal bond. As stated above, realizing such a bond requires a long process which is disadvantageous in terms of the process throughput, especially in the case of die-to-wafer bonding.

According to the disclosed technology, this problem is solved by providing additional bonding structures on the components. In the case shown in the drawings, the die 1 is provided with a number of solder bumps 11, while the wafer 2 is provided with contact areas 12 corresponding to the locations of the solder bumps 11 when the die is aligned to the wafer. According to some embodiments, the solder bumps 11 and contact areas 12 are dummy contact structures, that is, they are not electrically connected to the FEOL parts and to the BEOL networks of the respective components, as they primarily serve another purpose, namely to establish a fast solder bond between the components 1 and 2, without realizing the actual metal-metal bond between the bumps 10 and the contact pads 6. The actual metal-metal bond is realized in a subsequent heating step.

Figure 3:
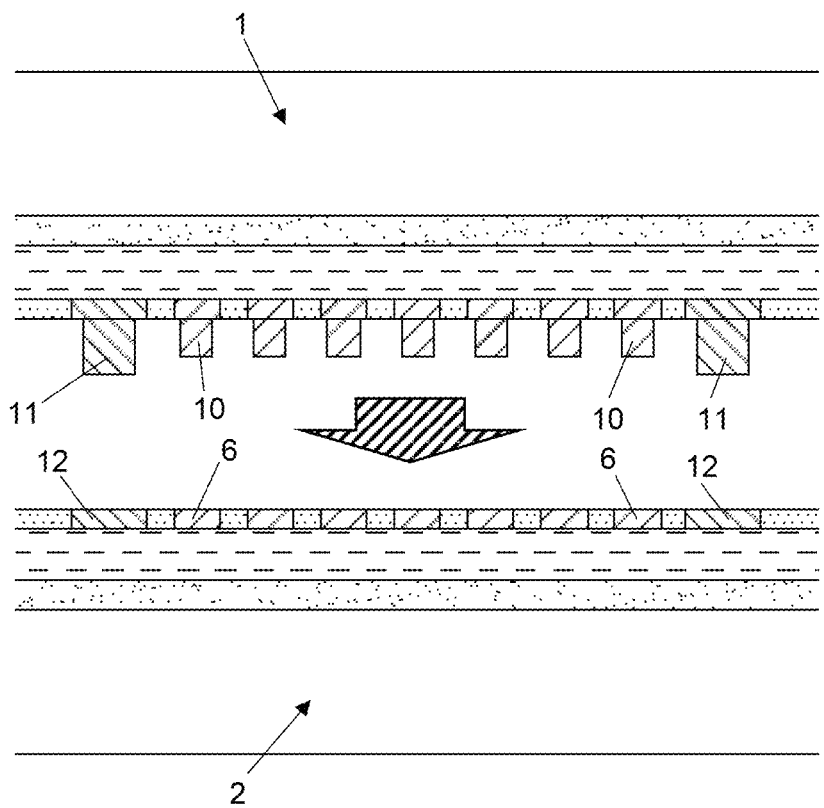
FIG. 3 illustrates the alignment of the die from FIGS. 1A-1B to the wafer of FIGS. 2A-2B.
Figure 4:
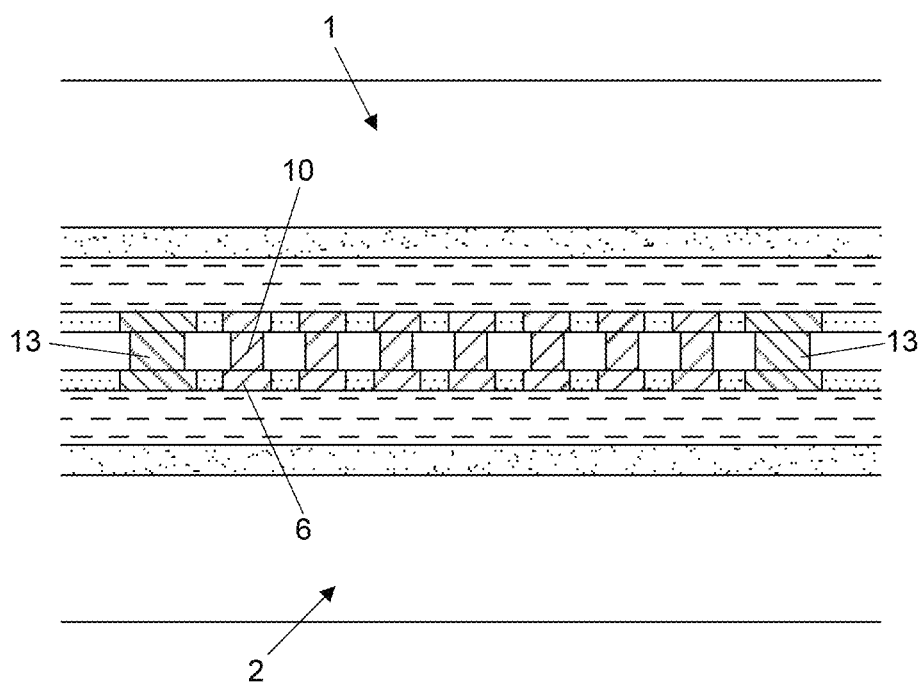
FIG. 4 illustrates the result of the bonding of the die to the wafer through soldering the solder bumps to the contact areas.

As illustrated in FIG. 3, the die 1 is aligned to the wafer 2, by aligning the solder bumps 11 to the contact areas 12, and the contact bumps 10 to the contact pads 6. The die 1 is lowered towards the wafer 2 so that the solder bumps 11 are in physical contact with the contact areas 12 (see FIG. 4), at which point the solder bumps 11 are pressed to the contact areas 12 and the temperature is rapidly raised above the melting point of the solder material so that the solder melts and forms a solder connection 13 consisting fully or for the most part of an intermetallic compound (IMC) when the temperature is again lowered. The IMC is a compound of the solder metal with the metal of the contact area 12 and/or of the pad 6 of the die onto which the solder bump 10 is placed. This process is known as the TCB process (thermocompression bonding). This is therefore a solder process as known in the art, and the process can be executed using any suitable practice and using existing processing tools. As known to the skilled person, this soldering process is fast, and may be realized in the order of seconds, for example in about 5 seconds for most of the known combinations of solder metal and metals of the contact areas 12 and of the contact pads 6. Any of such known combinations may be used in the method of the disclosed technology. The melting temperature of the solder is lower than the melting temperature of the metal used for the metal contact bumps 10 and the corresponding contact pads 6.

The short duration of about 5 seconds referred to above includes a full temperature cycle, for example, heating above the solder melting point, formation of the IMC and lowering of the temperature (in practice this can be done by removing the heat source). The result of this cycle is a solidified solder connection 13.

Due to the melting of the solder, the solidified solder connections 13 are of lower height than the initial height of the solder bumps 11. As shown in the drawings, the initial height of the solder bumps 11 is chosen to be higher than the height of the metal contact bumps 10, so that after the soldering process, these contact bumps 10 of the die 1 are in physical contact with the contact pads 6 of the wafer 2. For example, the height of the solder bumps 11 may be 5 micrometers, with the metal bumps 10 having a height of 3 micrometers. These heights and the pressure applied during TCB bonding are configured so that after the soldering process, the metal bumps 10 of the die and the metal pads of the wafer form a so-called "cold joint". The metal-metal bond is not realized at this point, as this requires a prolonged heating process in order to obtain interdiffusion of the metal of the bumps 10 and the contact pads 6. An advantage of forming a "cold joint", for example, a physical contact between the contact structures 10 and 6, after the soldering step, is that no contamination of the contact structures is possible once the solder connections are established. If a gap remains between the contact structures, such contamination could occur through small particles entering this gap.

According to the disclosed technology, the heating process for establishing the metal-metal bonds takes place after the soldering process, for example after realizing solidified solder connections 13. However, because the solder connections 13 have already bonded the die 1 to the wafer 2, this heating process does not need to be performed separately for each die. Several dies can be bonded to the wafer using the above-described soldering approach, followed by a heating process for realizing the metal-metal bonds between the plurality of dies and the wafer. The heating process may for example be performed by heating the assembly of the wafer and several dies to a temperature of about 300° C. for a period of about one hour. As the contact structures 10 and 6 are already joined by a cold joint, the final bond is achievable by heating only. No compression force for pressing the two components together during heating is required.

This approach thereby enables to increase the throughput of the die-to-wafer bonding process, as only one heating process is required to establish the metal-metal bonds between the wafer and a plurality of dies, whereas in the prior art, the heating process was required separately for each die.

The heating step could be performed in the same tool as the soldering step, or in a different tool, for example by moving the assembly of the wafer 2 and the die 1 to a heating oven and applying the heat treatment in that oven. This furthermore enables subjecting multiple assemblies of wafers having one or more dies pre-bonded to them through the above-described soldering step to the heating step by loading a batch of such wafers into the oven.

The method of the disclosed technology can also be applied for bonding a wafer to another wafer. The above-described batch could thus also include one or more wafer-wafer assemblies.

The intermetallic compound must have a higher melting point than the temperature applied during the heating step, which is the case in most soldering processes. In this way, the IMC does not melt during the heating step performed according to the disclosed technology, after the soldering step. If the solder connections 13 still include a small amount of solder material, this amount will melt during the heating step, but this is allowable and will even be helpful in pulling the components together.

As seen in the drawings, the diameter of the solder bumps 11 can be higher than the diameter of the metal bumps 10. According to yet another embodiment, the surface area of the solder bumps 11 and the contact areas 12 is chosen sufficiently high so as to enable the ability of the molten solder material to realize an auto-alignment of the die 1 to the wafer 2, due to capillary forces generated by the liquid solder material, which will automatically cause the solder bumps 11 to align to the contact areas 12.

Because of the auto-alignment aspect, the disclosed technology is particularly advantageous for realizing bonds between arrays of contact bumps 10 and contact pads 6 with very low diameter and pitch, for example in the order of a 10-micron pitch or less.

The disclosed technology is not limited to the example shown in the drawings, where a number of solder bumps 11 are placed specifically around a group of contact bumps 10. The solder bumps 11 could be distributed more randomly across the surfaces of the components 1 and 2. However the deliberate placement of the solder bumps 11 in the vicinity of the contact bumps 10, especially in the vicinity of an array of closely pitched contact bumps 10, represents a further embodiment of the disclosed technology. The solder bumps 11 are not necessarily placed on the component provided with contact bumps 10, but could instead be provided on the other component.

According to another embodiment, a dielectric underfill material is applied that fills up the gaps between the interconnected solder bumps and metal contact bumps. The underfill may be applied before bonding, or after the soldering step and before the heating step. Suitable methods for applying the underfill in both cases, and any suitable underfill materials, may be applied as such in the disclosed technology.

Figure 5:
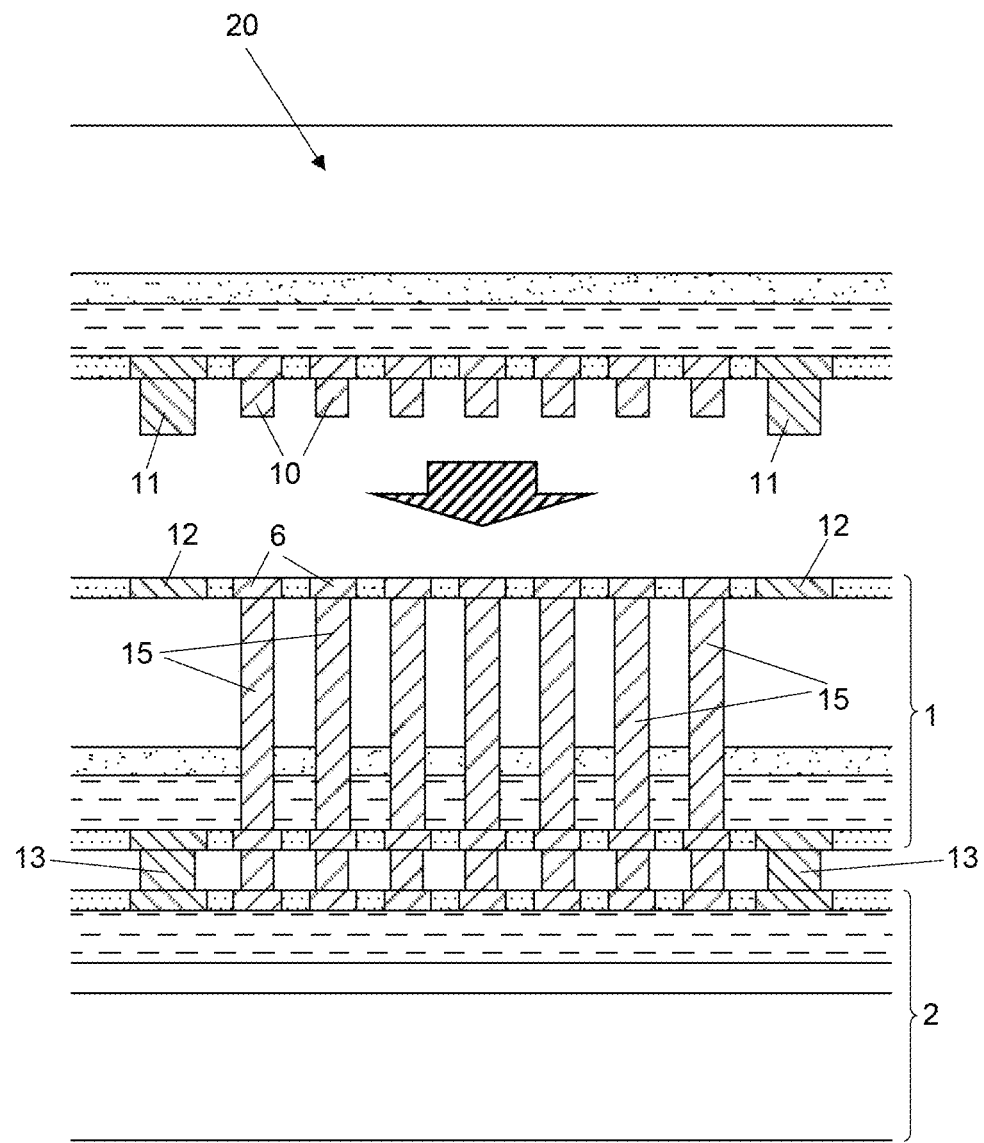
FIG. 5 illustrates an embodiment wherein two dies are stacked on the wafer 1.

The disclosed technology is also applicable to the stacking of multiple dies, one on top of the other. FIG. 5 illustrates an embodiment wherein two dies are stacked on the wafer 1. The first die 1 is now provided with TSV connections 15 through the substrate 3, which connect the contact bumps 10 to contact pads 6 on the back side of the die 1. Also, dummy contact areas 12 are provided on the backside of the die 1. The contact pads 6 and the dummy contact areas 12 on the back side of the die 1 are configured to receive, respectively, the metal contact bumps 10 and dummy solder bumps 11 of the second die 20, which is to be bonded to the backside of the first die 1. According to the disclosed technology, the sequence is as follows:

aligning the first die 1 to the wafer 2 and realizing the solidified solder connections 13, aligning the second die 20 to the first die 1 and realizing solidified solder connections between the solder bumps 11 of the second die 20 and the contact areas 12 on the back side of the first die 1, and heating the assembly of the wafer 2 and the two dies 1 and 20 to a bonding temperature to establish metal-metal bonds between the first die 1 and the wafer 2 and between the second die 20 and the first die 1.

The stack may include more than two dies. The final heating step takes place after all the dies have been bonded by the respective solder connections.

While the disclosed technology has been illustrated and described in detail in the drawings and foregoing description, such illustration and description are to be considered illustrative or exemplary and not restrictive. Other variations to the disclosed embodiments can be understood and effected by those skilled in the art in practicing the disclosed technology, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

What is claimed is:

1. A method of bonding a first semiconductor component to a second semiconductor component, at least one of the components comprising a plurality of protruding metal contact structures, by bonding the plurality of protruding contact structures to corresponding protruding metal contact structures or metal contacts pads on the other component, the bonding taking place by direct metal to metal contact bonding, wherein
one of the components is provided with a plurality of dummy solder bumps for establishing solidified solder connections between the solder bumps and corresponding contact areas provided on the other component, the method comprising:
aligning the components so that the solder bumps are aligned to the corresponding contact areas;
realizing the solidified solder connections between the corresponding solders bumps and contact areas, wherein the solder bumps and contact areas are configured so that the protruding metal contact structures of one of the components are in physical contact with the corresponding protruding metal contact structures or the metal pads of the other component while not forming a metal bond, when the solidified solder connections are established, thereby obtaining an assembly of the first and second component bonded only through the solidified solder connections, wherein the solidified solder connections comprise an intermetallic compound (IMC); and
subjecting the assembly to a heat treatment for bonding the protruding metal contact structures to the corresponding metal structures or pads.

2. The method according to claim 1, wherein the surface area of the solder bumps and the contact areas is chosen so that during the soldering process applied for realizing the solder connections, the molten solder material enhances the alignment of the solder bumps to the contact areas due to a self-aligning influence of the capillary forces exhibited by the molten material on the solder bumps and the contact areas.

3. The method according to claim 2, wherein the surface area of the solder bumps is higher than the surface area of the metal contact structures.

4. The method according to claim 1, wherein the first component is a semiconductor die, and the second component is a semiconductor wafer.

5. The method according to claim 4, wherein a plurality of dies are bonded to the wafer by aligning and establishing solidified solder connections, and wherein subjecting the assembly to a heat treatment is performed simultaneously for the plurality of dies.

6. The method according to claim 4, wherein a plurality of dies are bonded in at least one stack, a first die being bonded to the wafer by aligning and establishing solidified solder connections, and one or more additional dies being bonded to the back side of preceding dies by aligning and establishing solidified solder connections, and wherein subjecting the assembly to a heat treatment is performed simultaneously for the at least one stack of dies.

7. The method according to claim 1, wherein the protruding metal contact structures and corresponding pads are arranged in a two-dimensional array, and wherein the solder bumps and corresponding contact areas are located around the respective arrays.

8. The method according to claim 1, wherein the protruding metal contact structures and the corresponding metal structures or pads are formed of the same metal.

\* \* \* \* \*